United States Patent [19]

Lee et al.

[11] Patent Number: 5,268,322
[45] Date of Patent: Dec. 7, 1993

[54] METHOD OF MAKING DRAM HAVING A STACKED CAPACITOR

[75] Inventors: Jung H. Lee, Seoul; Cheol S. Park, Seongnam-City, both of Rep. of Korea

[73] Assignee: Hyundai Electronics Industries Co., Ltd., Rep. of Korea

[21] Appl. No.: 781,404

[22] Filed: Oct. 23, 1991

[30] Foreign Application Priority Data

Oct. 25, 1990 [KR] Rep. of Korea ............... 90-17095

[51] Int. Cl.⁵ ........................... H01L 21/70
[52] U.S. Cl. ........................... 437/52; 437/47; 437/48; 437/60; 437/919
[58] Field of Search ............ 437/47, 48, 52, 60, 437/919; 257/309

[56] References Cited
U.S. PATENT DOCUMENTS

| | | | |
|---|---|---|---|
| 5,049,957 | 9/1991 | Inoue et al. | 437/52 |
| 5,068,698 | 11/1991 | Koyama | 437/52 |
| 5,071,781 | 12/1991 | Seo et al. | 437/52 |
| 5,102,820 | 4/1992 | Chiba | 437/52 |
| 5,164,337 | 11/1992 | Ogawa et al. | 437/52 |

*Primary Examiner*—Tom Thomas
*Attorney, Agent, or Firm*—Ladas & Parry

[57] ABSTRACT

A DRAM comprising a silicon substrate with a field oxide layer 2, gate oxide layer 3, gate electrode and gate electrode lines 4A, 4B, oxide spacers 5 and drain and source electrodes on the silicon substrate 1 to define a MOSFET 25 is disclosed. A first insulating layer 7 covers the MOSFET 25 except for a portion of said source electrode 6B. A charge storage electrode 11A, with at least one tunnel space 9B having walls formed therein, overlies the source electrode 6B and is in electrical contact with the source electrode 6B. A capacitive dielectric layer 13 covers the charge storage electrode 11A and the walls 9C of each the tunnel space 9B. A plate electrode 14A is formed on the capacitive dielectric layer 13 and covers the charge storage electrode 11A and on the walls of each tunnel space 9B to define a stack capacitor having an increased area for the charge storage electrode 11A which results in an increased capacitance of the stack capacitor. A third insulating layer 15 covers at least the plate electrode 14A, except for a portion of the drain electrode 6A; and a bit line electrode 17 formed on the third insulating layer 15 is electrically connected to the drain of the MOSFET. A method of manufacturing the DRAW having at least one tunnel plate electrode is also disclosed.

8 Claims, 8 Drawing Sheets

METHOD OF MAKING DRAM HAVING A STACKED CAPACITOR

BACKGROUND OF INVENTION

1. Field of the Invention

The invention relates to a DRAM having a stacked capacitor of a highly integrated semiconductor memory device and the method for manufacturing thereof, and more particularly, to a DRAM cell having a stacked capacitor which includes a charge storage electrode having a tunnel space formed therethrough, on which capacitive dielectric layer is deposited, and a plate electrode formed at the entire surface of the charge storage electrode including the space, respectively, in order to increase the capacitance of a capacitor, and the method for manufacturing thereof.

2. Information Disclosure Statement

Generally, as the integrity of a DRAM increases, new type charge storage electrode structures which can be applied to the next generation DRAM have been developed.

In the above mentioned cell structure, there are a cylindrical structure, fin structure, spread stacked capacitor and surrounding gate transistor cell.

However, in the above mentioned structure, since the manufacturing process is very difficult and a number of process steps are required, there is a problem in that the manufacturing price is high and the reliability is low.

Therefore, it is an object of the present invention to provide a DRAM having a stacked capacitor which can increase the capacitance of the capacitor and solve the problems due to the difficulty in the manufacturing process and the increase of unit price, and the method for manufacturing thereof.

The preceding objects should be construed as merely presenting a few of the more pertinent features and applications of the invention. Many other beneficial results can be obtained by applying the disclosed invention in a different manner or modifying the invention within the scope of the disclosure. Accordingly, other objects and a fuller understanding of the invention may be had by referring to both the summary of the invention and the detailed description, below, which describe the preferred embodiment in addition to the scope of the invention defined by the claims considered in conjunction with the accompanying drawings.

SUMMARY OF THE INVENTION

A DRAM having a stacked capacitor and a method for manufacturing the dram are defined by the claims with a specific embodiment shown in the attached drawings.

For the purpose of summarizing the invention, the invention relates to the method of manufacturing a DRAM having a stacked capacitor comprising providing a silicon substrate with a field oxide layer 2, gate oxide layer 3, gate electrode and gate electrode lines 4A, 4B, oxide spacers 5 and drain and source electrodes on the silicon substrate 1 to form a MOSFET 25. A first insulating layer 7 is deposited on the entire surface of the resulting structure comprising the gate electrode and gate electrode lines 4A, 4B. A first contact hole 7A is formed by removing a portion of the first insulating layer on the source electrode 6B to expose a portion of the source electrode 6B. A first conducting layer 8 for charge storage electrode is deposited on the first insulating layer 7 and on the exposed source electrode 6B through the first contact hole 7A to electrically connect the source electrode 6B. A second insulating layer 9 is deposited on the entire surface of the resulting structure. A first photoresistive layer 10 is deposited on the second insulating layer 9. A first pattern mask 10A having a linear dimension in the word line direction which is greater than the linear dimension in the bit line direction is formed by removing the first photoresistive layer 10 from the second insulating layer 9 to expose the second insulating layer 9 except for a remaining portion of the first photoresistive layer 10A and the underlying second insulating layer 9 positioned over the source electrode 6B. The exposed second insulating layer 9 is removed utilizing the first pattern mask 10A to expose the first conducting layer 8 except for remaining portions of the first conducting layer positioned over the source electrode 6B, of the second insulating layer 9A and of the first photoresistive layer 10A overlying the first conducting layer 8. The exposed second insulating layer 9 is preferably removed by an anisotropic etching process. The remaining portion of the first photoresistive layer 10A overlying the remaining second insulating layer 9A is then removed. A second conducting layer 11 for charge storage electrode is deposited over the resulting structure comprising the remaining portion of the second insulating layer 9A overlying the first conducting layer 8. A second photoresistive layer 12 is deposited on the second conducting layer 11. A mask pattern 12A for charge storage electrode is formed by forming a second pattern mask 12A having a linear dimension greater than the linear dimension of the first pattern mask 10A in the bit line direction and having a linear dimension smaller than that of the first pattern mask 10A in the word line direction over a predetermined region positioned above the source region 6B by removing the second photoresistive layer 12 to expose the second conducting layer 11 except for the remaining portion of the second conducting layer 11B underlying the second pattern mask 12A. The exposed portion of the second conducting layer 11 is etched utilizing the second pattern mask 12A by an anisotropic etching process. The remaining portion of the second insulating layer 9A enclosed between the remaining portion of the second conducting layer 11B for charge storage electrode and the first conducting layer 8 for charge storage electrode is removed by a wet etching process thereby forming a tunnel space 9B between the second conducting layer 11B and the first conducting layer 8 in the word line direction. The exposed first conducting layer 8 for charge storage electrode 8 is removed by anisotropically etching utilizing the second pattern mask 12A to thereby form a charge storage electrode 11A consisting of the remaining second conducting layer 11B and the first conducting layer 8 and a tunnel space 9B overlying the source electrode 6B and then removing the second pattern mask 12A. A capacitive dielectric layer 13 is formed on the entire surface of the charge storage electrode 11A and on the walls 9C of the tunnel space 9B. A third conducting layer 14 for plate electrode is deposited on the entire surface of the charge storage electrode 11A including on the capacitive dielectric layer formed on the walls of the tunnel space 9B. A plate electrode 14A is formed by removing a predetermined portion of the third conducting layer 14 from a portion overlying 14C the drain electrode 6A to thereby form a stack capacitor 18 having an increased area for the charge storage electrode 11A thereby increasing the capacitance of the stack capacitor.

The method may further include a third insulating layer 15 deposited on the entire surface of the resulting structure comprising the plate electrode 14A and removing the third insulating layer 15 deposited on the drain electrode 6A to form a second contact hole 16 and to expose the surface of the drain electrode 6A. A bit line electrode 17 is formed on the third insulating layer 15 and on the first insulating layer 7 exposed on the wall of the second contact hole 16 to electrically connect the bit line electrode through the second contact hole 16 to the drain of the MOSFET.

The first contact hole 7A is preferably formed utilizing a contact mask.

The first conducting layer 8 for charge storage electrode, a second conducting layer 11 for charge storage electrode, a third conducting layer 14 are preferably formed of polysilicon. The polysilicon layer of the second conducting layer 11 for charge storage electrode is deposited as thick as 1000 Angstrom and the polysilicon layer of the third conducting layer 14 for plate electrode is deposited as thick as 1500 Angstroms.

The DRAM comprises a silicon substrate with a field oxide layer 2, gate oxide layer 3, gate electrode and gate electrode lines 4A, 4B, oxide spacers 5 and drain and source electrodes on the silicon substrate 1 to define a MOSFET 25. A first insulating layer 7 covers the MOSFET 25. A first contact hole 7A formed through the insulating layer exposed a portion of the source electrode 6B. A charge storage electrode 11A, with at least one tunnel 9B formed therein and with each the tunnel being provided with walls, is directly positioned over the source electrode 6B and is in electrical contact with the source electrode 6B via the first contact hole 7A. A capacitive dielectric layer 13 covers the charge storage electrode 11A and the walls 9C of each the tunnel 9B. A plate electrode 14A on the capacitive dielectric layer 13 covers the charge storage electrode 11A and on the walls of each the tunnel 9B to define a stack capacitor having an increased area for the charge storage electrode 11A resulting in an increased capacitance of the stack capacitor. A third insulating layer 15 covers the plate electrode 14A and a bit line electrode 17 is on the third insulating layer 15 and is electrically connected to the drain of the MOSFET through a second contact hole 16 formed through the third insulating layer 15.

The number of tunnels formed in the charge storage electrode 11A is preferably two. However, the desired number will be determined on the desired capacitance.

The more pertinent and important features of the present invention have been outlined above in order that the detailed description of the invention which follows will be better understood and that the present contribution to the art can be fully appreciated. Additional features of the invention described hereinafter form the subject of the claims of the invention. Those skilled in the art can appreciate that the conception and the specific embodiment disclosed herein may be readily utilized as a basis for modifying or designing other structures for carrying out the same purposes of the present invention. Further, those skilled in the art can realize that such equivalent constructions do not depart from the spirit and scope of the invention as set forth in the claims.

BRIEF DESCRIPTION OF THE DRAWINGS

For fuller understanding of the nature and objects of the invention, reference should be had to the following detailed description taken in conjunction with the accompanying drawings in which.

The novel feature of the present invention may be understood from the accompanying description when taken in conjunction with the accompanying drawings.

Similar reference characters refer to similar parts throughout the several views of the drawings.

DETAILED DESCRIPTION OF THE INVENTION

Figure 1A:
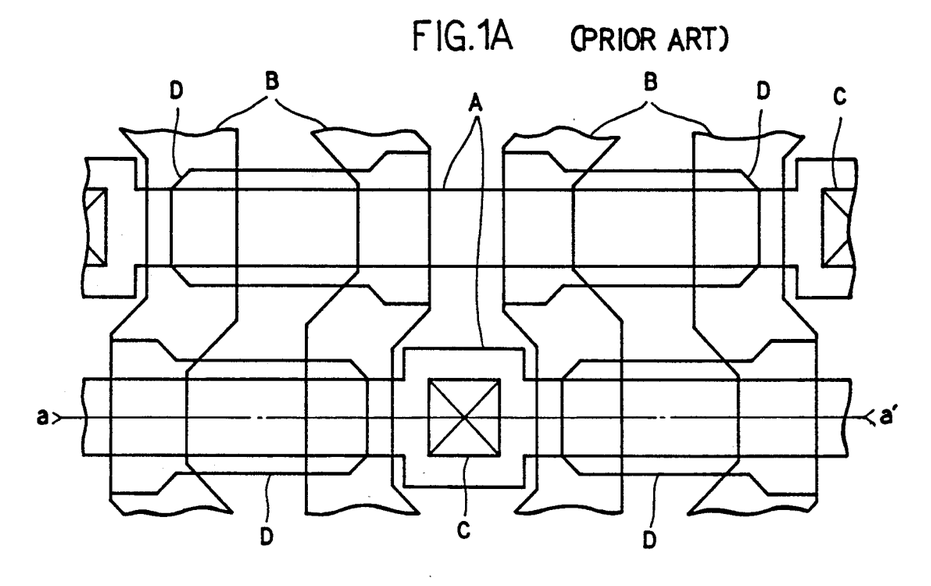
FIG. 1A illustrates the layout of the prior art DRAM.

FIG. 1A illustrates the layout arrangement of a word line mask B, bit line mask A, charge storage electrode mask D and bit line contact mask C, on a silicon substrate for manufacturing a stacked capacitor according to the prior art. Accordingly, after completing the manufacture of the stack capacitor according to the above mentioned masks, the arrangement/position of the charge storage electrode can be seen by using the charge storage electrode mask D.

Figure 1B:
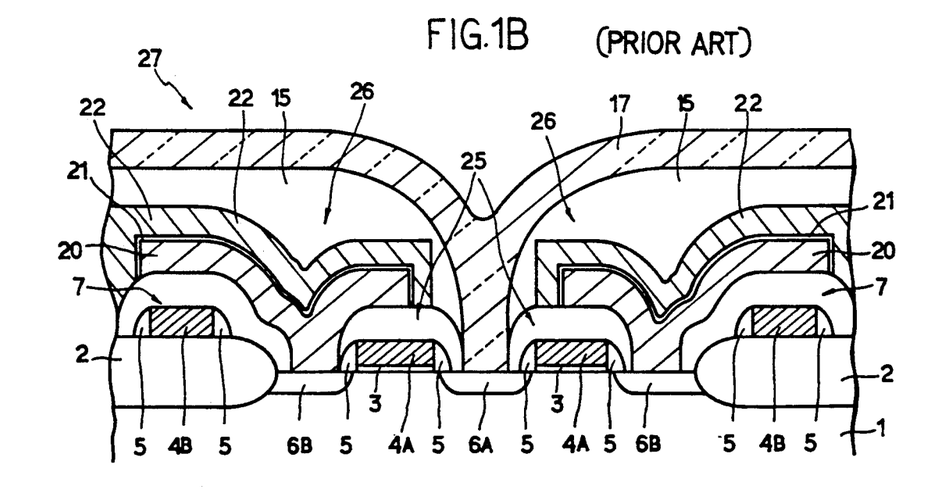
FIG. 1B illustrates the cross-section taken along the line a—a' of FIG. 1A.

FIG. 1B illustrates a cross-section of the prior art stacked capacitor of the DRAM taken along the line a—a' of FIG. 1A.

Referring to FIG. 1B, a MOSFET 25 including a field oxide layer 2 on a silicon substrate 1, a gate oxide layer 3, a gate electrode and gate electrode line 4A, 4B, an oxide spacers 5, a drain and source electrode 6A and 6B and a first insulating layer 7 is shown. A stacked capacitor including a charge storage electrode 20 connected to the source electrode 6B of the MOSFET 25, a capacitive dielectric layer 21 and a plate electrode 22 are also formed to thereby define a DRAM cell 27 which includes the MOSFET 25 and the charge storage electrode 20. A bit line 17 is then connected to the drain electrode 6A of the MOSFET 25. The structure of the DRAM cell 27 isd formed in a left-right symmetrical structure from the drain electrode 6A.

However, in a prior art stack capacitor structure, it is impossible to obtain the capacitance of 30fF (fento Farad) per unit cell, which is necessary for DRAMs above 16M. Accordingly, the present invention is directed to a DRAM cell having a stacked capacitor comprising at least one new tunnel charge storage electrode structure.

Figure 2:
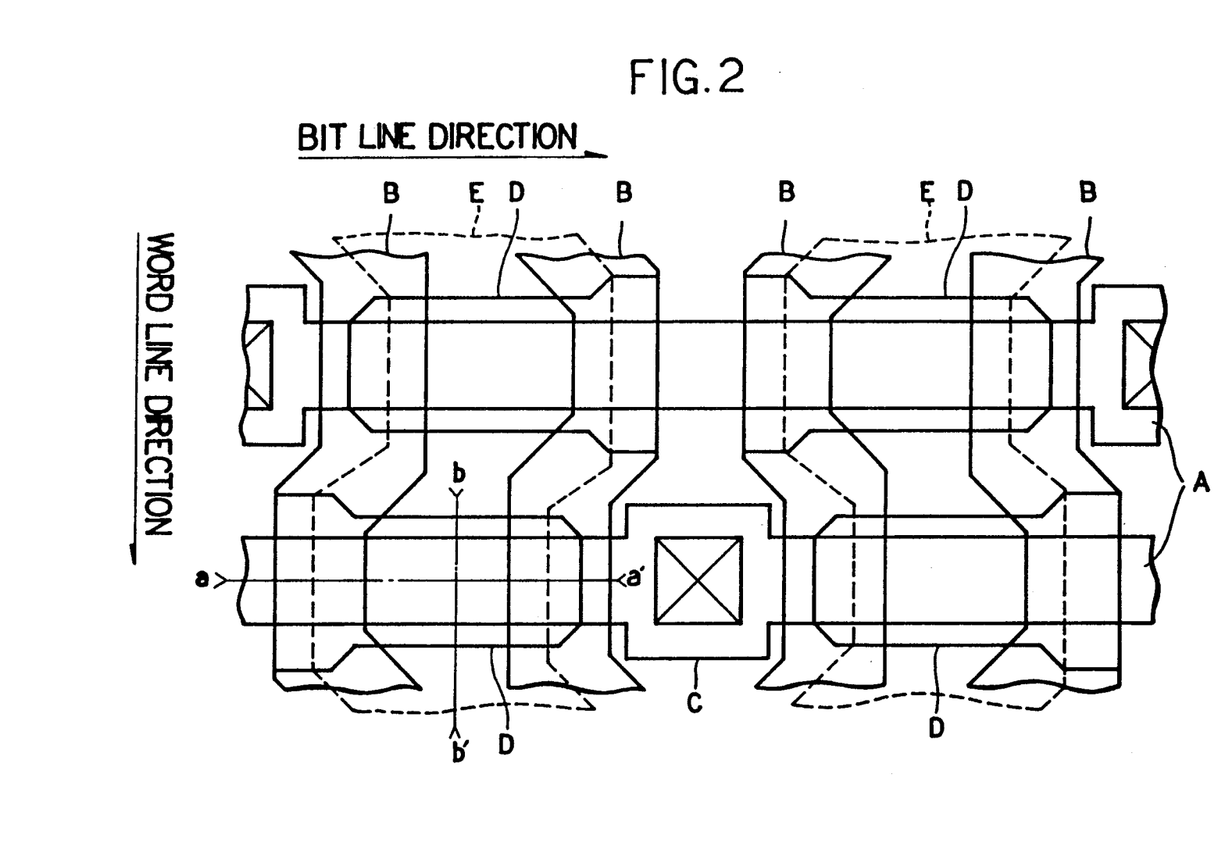
FIG. 2 illustrates the layout of the DRAM according to the present invention.

FIG. 2 illustrates a layout arrangement of a word line mask B, bit line mask A, a bit line contact mask C, a charge storage electrode mask D and an oxide layer pattern mask E on the silicon substrate for manufacturing the stacked capacitor according to the present invention.

FIG. 2 is similar to the layout of the FIG. 1 except for the addition of an oxide layer pattern mask E illustrated in a dotted line.

FIGS. 3A through FIG. 3I illustrate cross-sections taken along the line a—a' of FIG. 2 in the bit line direction, FIGS. 4A through 4I illustrate cross-sections taken along the line b—b' of FIG. 2 in the word line direction.

Figure 3A:
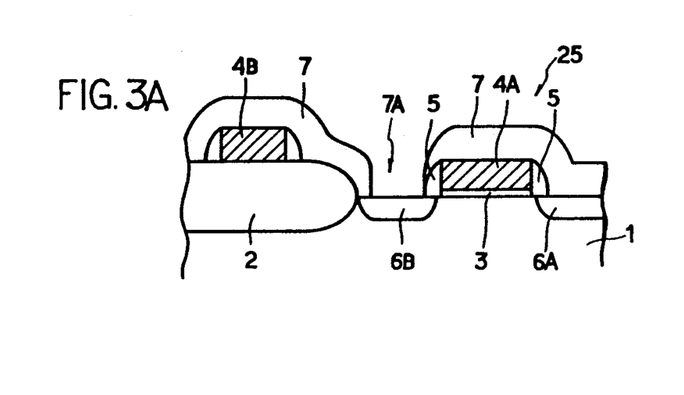
FIGS. 3A through 3I illustrate the process steps for forming a stack capacitor of DRAM according to the first embodiment of present invention taken along the line a—a' of FIG. 2.

FIG. 3A illustrates a field oxide layer 2, gate oxide layer 3, gate electrode and gate electrode lines 4A, 4B, oxide spacers 5 and drain and source electrodes 6A, 6B on a silicon substrate 1 formed by the prior art. A first insulating layer 7, for example an oxide layer is formed on the entire surface including the above mentioned resulting structure to thereby form a MOSFET 25. For connecting a charge storage electrode of the stacked capacitor to the source electrode 6B of the MOSFET 25, a first contact hole 7A is formed by removing a portion of the first insulating layer on the source electrode 6B utilizing a contact mask (not shown), to expose the source electrode.

Figure 4A:
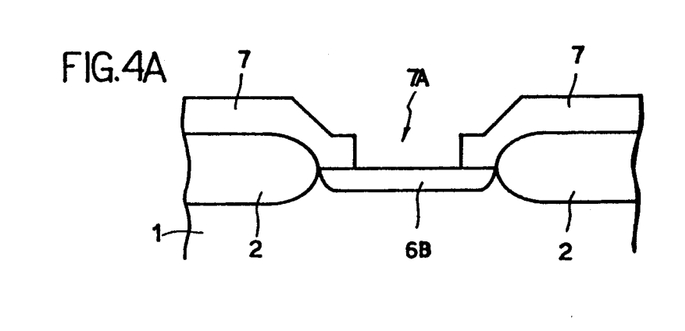
FIGS. 4A through 4I illustrate the process steps for forming a stacked capacitor of DRAM according to the first embodiment of the present invention taken along the line b—b' of FIG. 2.

FIG. 4A illustrates a cross-section taken along the line b—b' of the FIG. 2 in the word line direction, in which the first contact hole 7A is formed on the source electrode 6B. It is noted that the first contact hole 7A can also be formed by depositing a conducting layer on the first insulating layer 7 before the formation of the first contact hole 7A, and removing a portion of the conducting layer and the first insulating layer on the source electrode by utilizing the contact mask.

Figure 3B:
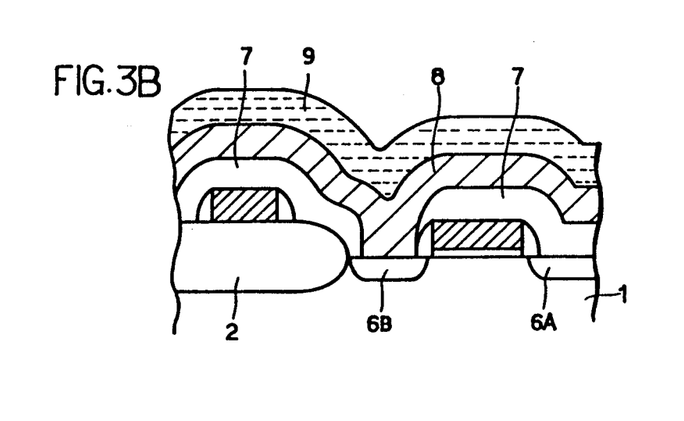
Figure 4B:
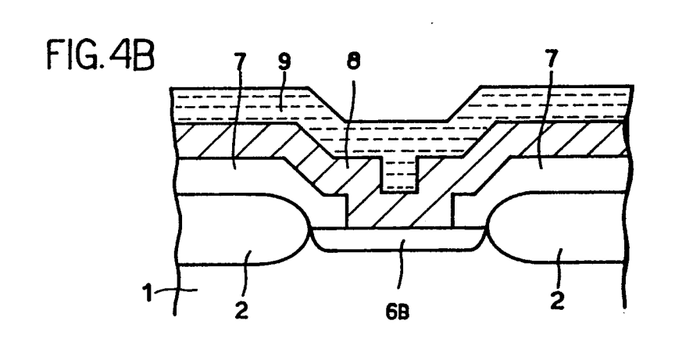

In FIG. 3B, a first conducting layer 8 for charge storage electrode, for example, a polysilicon layer, is deposited, as thick as 1500 Angstroms, on the first insulating layer 7 and on the exposed source electrode 6B through the first contact hole 7A. An impurity is then implanted into the polysilicon layer as thick as $8 \times 10^{-15}$ Cm$^2$, an annealing process is performed. The second insulating layer 9, for example a buffer oxide layer, is deposited on the entire surface of the resulting structure. FIG. 4B illustrates the cross-section of the structure of FIG. 3B in the word line direction.

Figure 3C:
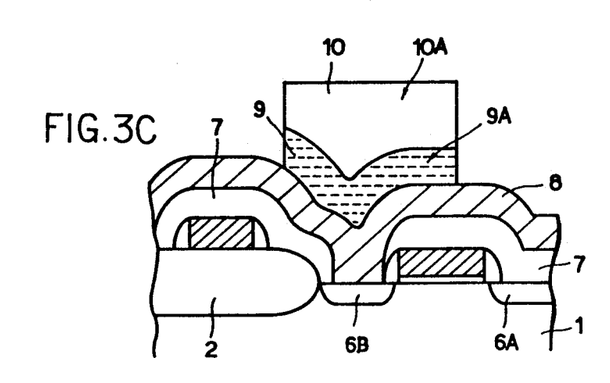

FIG. 3C illustrates the cross-section in which a first photoresistive layer 10 is deposited on the second insulating layer 9, a first pattern mask 10A is formed by removing a portion of a first photoresistive layer at the predetermined region (the oxide layer pattern mask E of FIG. 2) positioned over the source 6B, and the second insulating layer 9 exposed by the first pattern mask is etched by an anisotropic etching process, thereby forming a remaining portion 9A of the second insulating layer 9.

Figure 4C:
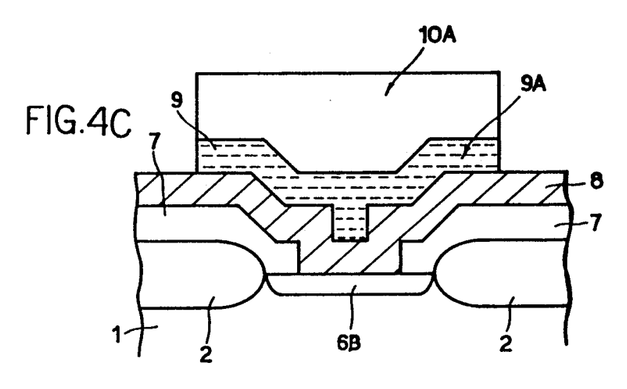

As illustrated in FIG. 4C, the linear dimension of the first pattern mask 10A in bit line direction is less than the linear dimension of the first pattern mask 10A in the word line direction.

Figure 3D:
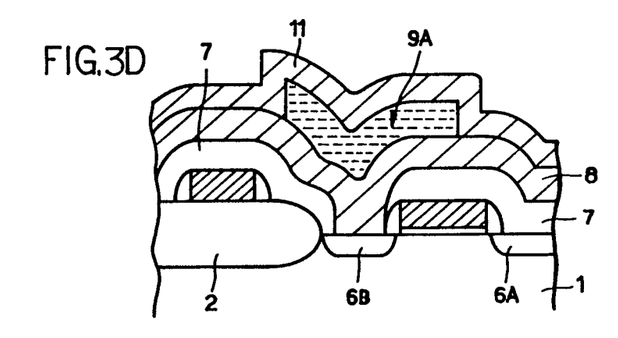
Figure 4D:
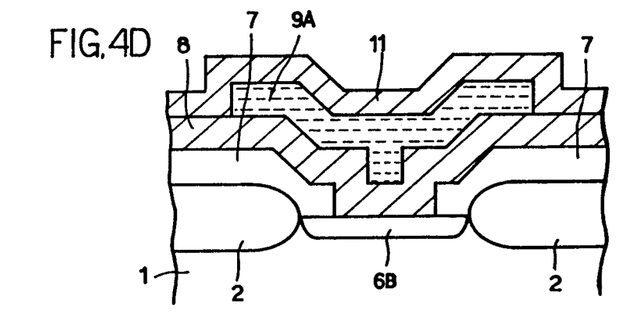

Referring to FIG. 3D, the first pattern mask 10A is removed, and a second conducting layer 11 for charge storage electrode, for example a polysilicon layer, is deposited as thick as 1000 Angstroms. An impurity is implanted into polysilicon layer, as thick as $8 \times 10^{-15}$ Cm$^2$, by an ion implantation process, and an annealing process is performed. FIG. 4D illustrates the cross-section of structure of FIG. 3D taken along the word line direction.

Figure 3E:
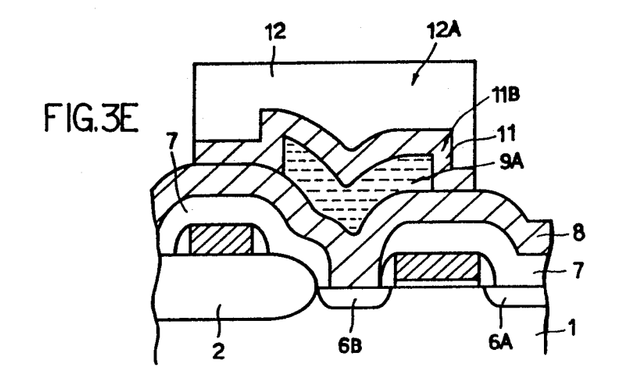
Figure 4E:
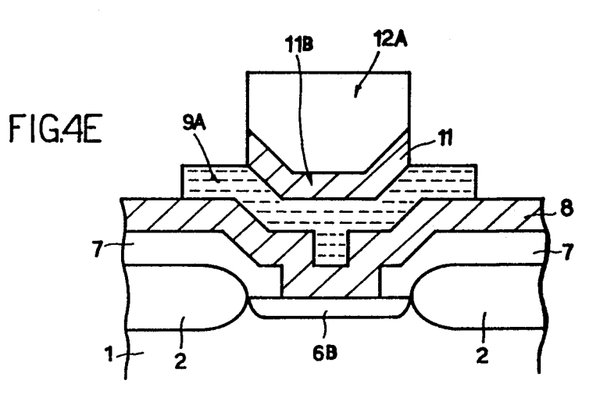

Referring to FIG. 3E, a second photoresistive layer 12 is deposited on the second conducting layer 11. For forming a mask pattern for charge storage electrode, a second pattern mask 12A having a linear dimension greater than the linear dimension of the first pattern mask 10A in bit line direction is formed at the predetermined region (charge storage electrode mask region D of FIG. 2) positioned above the source region 6B. On the other hand, the linear dimension of the second pattern mask 12A in the word line direction is less than the linear dimension of the first pattern mask 10A in word line direction as shown in FIG. 4E. The exposed portion of the second conducting layer 11 exposed by the second pattern mask 12A is etched by an anisotropic etching process thereby a second conducting layer 11B remains underlying the second pattern mask 12A.

FIG. 4E illustrates a cross-section of the structure of FIG. 3E in the word line direction. In the bit line direction, the second conducting layer 11 beneath the second pattern mask 12A covers the remaining second insulating layer 9A so that the remaining second conducting layer 11B is connected to the first conducting layer 8. In the word line direction, a portion of the remaining second insulating layer 9A is covered so that each side surface of the second insulating layer is exposed.

Figure 3F:
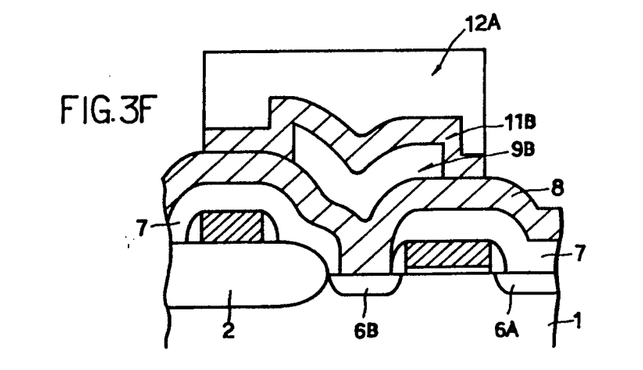

FIG. 3F illustrates a cross-section in which the resulting second insulating layer in the word line direction, which is exposed by the process of FIG. 3E, and the second insulating layer 9A between the second conducting layer 11B for charge storage electrode and the first conducting layer 8 for charge storage electrode are entirely removed by a wet etching process so that the tunnel space 9B therebetween is formed in the word line direction.

Figure 4F:
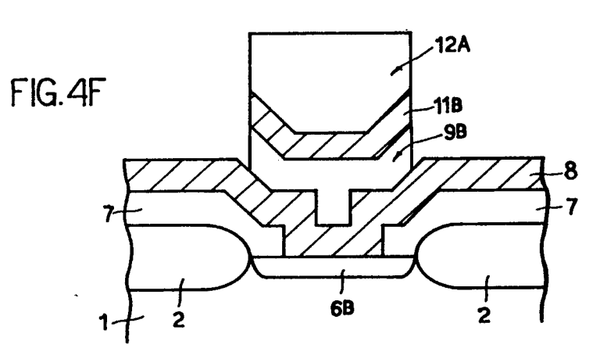

Referring to FIG. 4F, the second insulating layer 9A of FIG. 4E is removed so that the tunnel space 9B is formed and the underlying first conducting layer 8 for charge storage electrode is exposed.

Figure 3G:
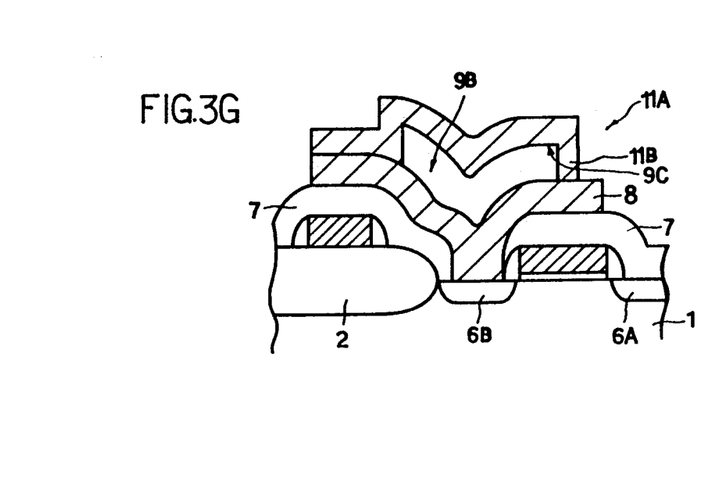

Referring to FIG. 3G, the exposed first conducting layer 8 for charge storage electrode 8 is removed by anisotropically etching utilizing the second pattern mask 12A to thereby form a charge storage electrode 11A having a tunnel space 9B. The second pattern mask 12A is then removed.

Figure 4G:
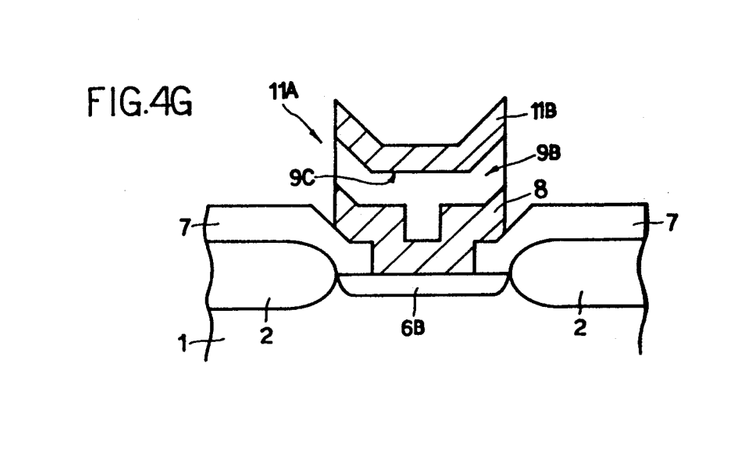
Figure 4H:
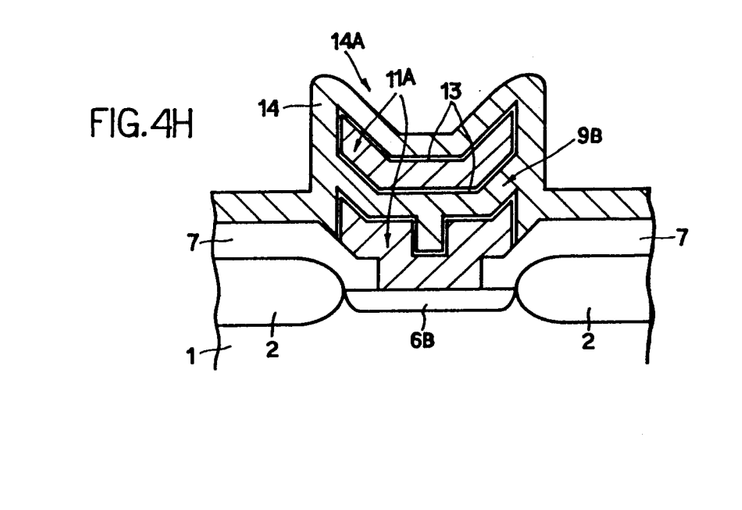

FIG. 4G illustrates a cross-section in line direction of FIG. 3G and illustrates the structure of the charge storage electrode 11A including the tunnel space 9B formed therethrough in the word line direction.

Figure 3H:
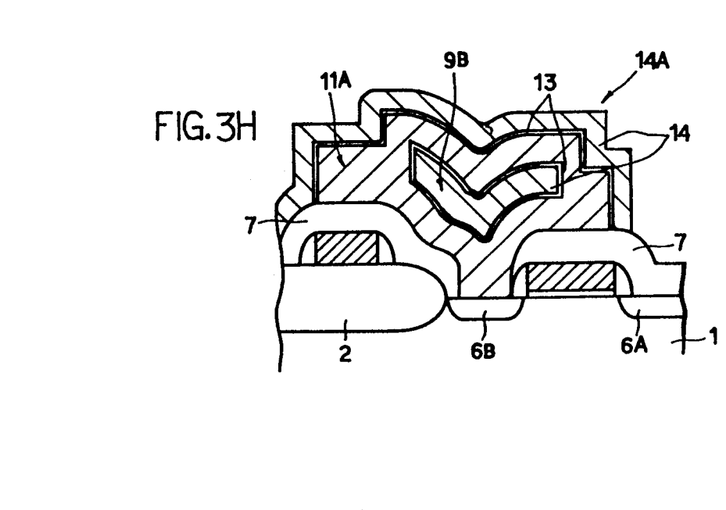

Referring to FIG. 3H, a capacitive dielectric layer 13 is formed on the entire surface of the charge storage electrode 11A and on the walls 9C of the tunnel space 9B, respectively. A third conducting layer 14 for plate electrode, for example a polysilicon layer, is deposited as thick as 1500 Angstroms on the entire surface of the charge storage electrode 11A and into the space 9B. An impurity is then implanted into the polysilicon layer as thick as $8 \times 10^{-15}$ Cm$^2$ thereon. A plate electrode 14A is formed by removing the predetermined portion of the third conducting layer 14 using a pattern mask (not shown) for plate electrode, to thereby form a stack capacitor 18.

Referring to FIG. 3H, the plate electrode 14A is formed on the entire surface of the charge storage electrode 11A and into the space 9B. The plate electrode 14A and charge storage electrode 11A are insulated from the capacitive insulating layer 13 illustrated in FIG. 3H and FIG. 4H.

Figure 3I:
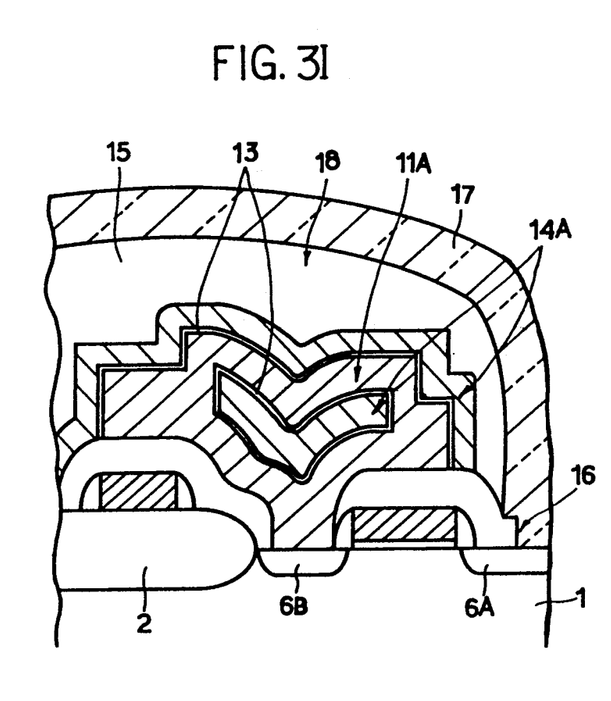
Figure 4I:
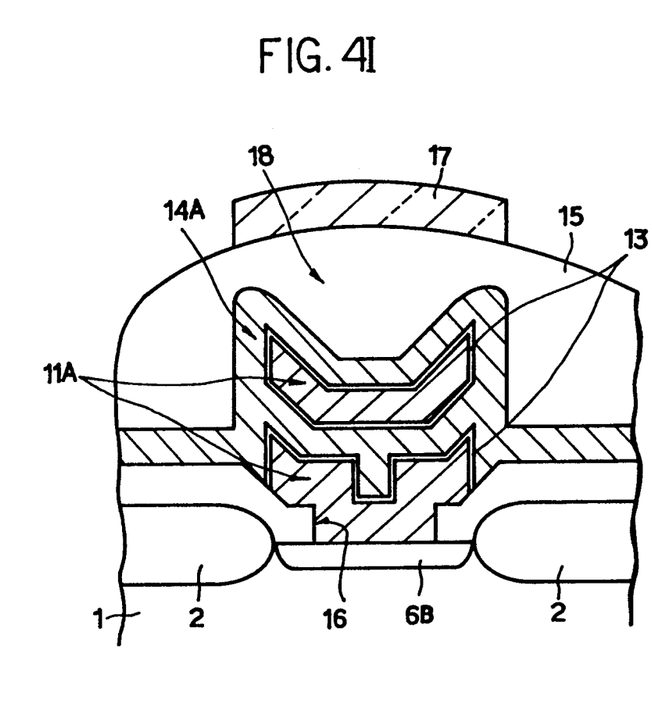

Referring to FIG. 3I, a third insulating layer 15 is deposited on the entire surface of the resulting structure comprising the plate electrode 14A. The third insulating layer 15 deposited on the drain electrode 6B is removed, thereby a second contact hole 16 is formed and the surface of the drain electrode 6A is exposed. As illustrated in FIG. 3I and FIG. 4I, a bit line electrode 17 is formed for connecting it through the second contact hole 16 to the exposed drain electrode 6A.

According to the present invention, as the space 9B is formed through the charge storage electrode 11A, and the plate electrode 14A is formed on the charge storage electrode 11A and into the space 9B, the area of the charge storage electrode 11A is relatively increased so that the capacitance of the stack capacitor can be increased.

Figure 5A:
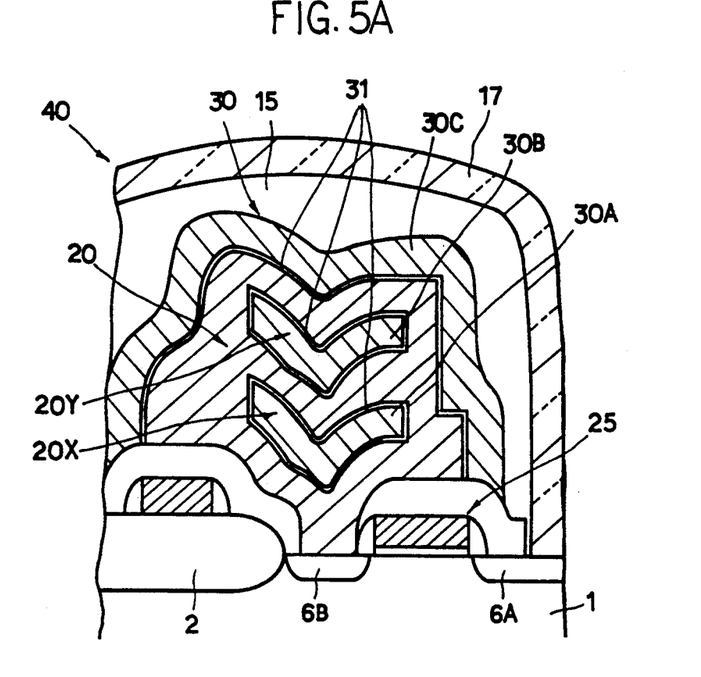
FIGS. 5A and 5B illustrate the process steps of stack capacitor of DRAM according to the second embodiment of the present invention.
Figure 5B:
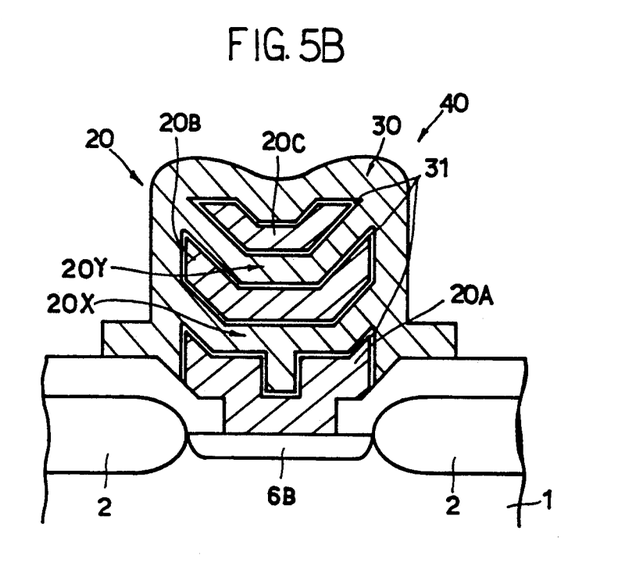

FIG. 5A and FIG. 5B illustrate cross-sections of the DRAM cell with regard to the manufacturing method which includes the process of forming comprising a stacked capacitor according to the second embodiment of the present invention. FIG. 5A illustrates a cross-section of the stacked capacitor in bit line direction according to the second embodiment of the present invention. Referring to the structure of the stacked capacitor 40, as illustrated, a charge storage electrode 20 connected to the source electrode 6B, is formed with a first tunnel space 20X and second tunnel space 20Y formed therethrough in the word line direction. A capacitive dielectric layer 31 is formed on the entire surface of the charge storage electrode 20 together with the entire surface of the first space 20X and second space 20Y. A plate electrode 30 comprising a first conducting layer 30A, second conducting layer 30B and third conducting layer 30C for plate electrode is formed on the entire surfaces of the charge storage electrode 20 and into the first space 20X and the second space 20Y, as illustrated in FIG. 5A and FIG. 5B. According to the above structure, the capacitance of the stacked capacitor is increased. It should be noted that the first conducting layer 30A, the second conducting layer 30B and the third conducting layer 30C for plate electrode forming the plate electrode are illustrated as being separated, however each is connected at an edge portion thereof in the word line direction as illustrated in FIG. 5B. For the similarity of other structure to those of FIG. 3I, the detailed description will be abbreviated.

FIG. 5B illustrates the cross-section of the structure of FIG. 5A in the word line direction.

Referring to FIG. 5B, the plate electrode 30 is formed into the first space 20X and second space 20Y of the charge storage electrode 20 comprising the first conducting layer 20A, the second conducting layer 20B and the third conducting layer 20C for charge storage electrode. The plate electrode 30 is also formed on the entire surface of the resulting structure. It should be also noted that the first conducting layer 20A and the second conducting layer 20B and the third conducting layer 20C for charge storage electrode forming a charge storage electrode 20 are illustrated as separated, however, each is connected at an edge portion thereof in bit line direction as shown in FIG. 5A. For the simplicity of the description, the detailed description of other structure will be abbreviated.

As set forth above, according to the present invention the stacked capacitor structure of the present invention can be applied to the next generation DRAM cell because of the increase in the integration ratio and also production efficiency is increased by the manufacturing process which can be easily applied to the mass production.

Although this invention has been described in its preferred form with a certain degree of particularity, it is appreciated by those skilled in the art that the present disclosure of the preferred form has been made only by way of example and that numerous changes in the details of the construction, combination and arrangement of parts may be resorted to without departing from the spirit and scope of the invention.

What is claimed is:

1. A method of manufacturing a DRAM having a stacked capacitor, said method comprising:

providing a silicon substrate with a field oxide layer 2, a gate oxide layer 3, gate electrode and gate electrode lines 4A, 4B, oxide spacers 5 and drain and source electrodes on the silicon substrate 1 forming a MOSFET 25;

depositing a first insulating layer 7 on the entire surface of the resulting structure comprising the gate electrode and gate electrode lines 4A, 4B;

forming a first contact hole 7A by removing a portion of the first insulating layer 7 on the source electrode 6B to expose a portion of the source electrode 6B;

depositing a first conducting layer 8 for charge storage electrode on the first insulating layer 7 and on the exposed source electrode 6B through the first contact hole 7A electrically connecting the source electrode 6B;

depositing a second insulating layer 9 on the entire surface of the resulting structure;

depositing a first photoresistive layer 10 on the second insulating layer 9;

forming a first pattern mask 10A having a linear dimension in the word line direction which is greater than the linear dimension in the bit line direction by removing the first photoresistive layer 10 from the second insulating layer 9 to expose the second insulating layer 9 except for a remaining portion of the first photoresistive layer 10A and the underlying second insulating layer 9 positioned over the source electrode 6B;

removing the exposed second insulating layer 9 utilizing the first pattern mask 10A thereby exposing the first conducting layer 8 except for remaining portions of the first conducting layer positioned over the source electrode 6B, of the second insulating layer 9A and of the first photoresistive layer 10A overlying the first conducting layer 8;

removing the remaining portion of the first photoresistive layer 10A overlying the remaining second insulating layer 9A;

depositing a second conductive layer 11 for charge storage electrode over the resulting structure comprising the remaining portion of the second insulating layer 9A overlying the first conducting layer 8;

depositing a second photoresistive layer 12 on the second conducting layer 11;

forming a mask pattern 12A for charge storage electrode by forming a second pattern mask 12A having a linear dimension greater than the linear dimension of the first pattern mask 10A in the bit line direction and with the second pattern mask 12A having a linear dimension smaller than the linear dimension of the first pattern mask 10A in the word line direction over a predetermined region positioned above the source region 6B by removing the second photoresistive layer 12 to expose the second conducting layer 11 except for the remaining portion of the second conducting layer 11B underlying the second pattern mask 12A;

etching the exposed portion of the second conducting layer 11 utilizing the second pattern mask 12A by an anisotropic etching process;

removing the remaining portion of the second insulating layer 9A enclosed between the remaining portion of the second conducting layer 11B for charge storage electrode and the first conducting layer 8 for charge storage electrode by a wet etching process thereby forming a tunnel space 9B between the second conducting layer 11B and the first conducting layer 8 in the word line direction;

removing the exposed first conducting layer 8 for charge storage electrode 8 by anisotropically etching utilizing the second pattern mask 12A to thereby form a charge storage electrode 11A consisting of the remaining second conducting layer 11B and the first conducting layer 8 and a tunnel space 9B overlying the source electrode 6B and then removing the second pattern mask 12A;

forming a capacitive dielectric layer 13 on the entire surface of the charge storage electrode 11A and on the walls 9C of the tunnel space 9B;

depositing a third conducting layer 14 for plate electrode, on the entire surface of the charge storage electrode 11A including on the capacitive dielectric layer formed on the walls of the tunnel space 9B; and forming a plate electrode 14A by removing a predetermined portion of the third conducting layer 14 from a portion overlying 14C the drain electrode 6A by a mask patterning process to thereby form a stack capacitor 18 having an increased area for the charge storage electrode 11A thereby increasing the capacitance of the stack capacitor.

2. The method of claim 1 further including depositing a third insulating layer 15 on the entire surface of the resulting structure comprising the plate electrode 14A;

removing the third insulating layer 15 deposited on the drain electrode 6A thereby forming a second contact hole 16 and exposing the surface of the drain electrode 6A; and forming a bit line electrode 17 on the third insulating layer 15 and on the first insulating layer 7 exposed on the wall of the second contact hole 16 to electrically connect the bit line electrode through the second contact hole 16 to the drain of the MOSFET.

3. The method of claim 1 wherein the first contact hole 7A is formed utilizing a contact mask.

4. The method of claim 1 wherein the first conducting layer 8 for charge storage electrode, a second conducting layer 11 for charge storage electrode, a third conducting layer 14 are polysilicon layers.

5. The method of claim 4 wherein the polysilicon layer of the second conducting layer 11 for charge storage electrode is deposited as thick as 1000 Angstroms.

6. The method of claim 16 wherein polysilicon layer of the third conducting layer 14 for plate electrode is deposited as thick as 1500 Angstroms.

7. The method of claim 1 wherein the exposed second insulating layer 9 is etched by an anisotropic etching process.

8. A method of manufacturing a DRAM having a stacked capacitor, said method comprising:

providing a silicon substrate with a field oxide layer 2, a gate oxide layer 3, gate electrode and gate electrode lines 4A, 4B, oxide spacers 5 and drain and source electrodes on the silicon substrate 1 forming a MOSFET 25;

depositing a first insulating layer 7 on the entire surface of the resulting structure comprising the gate electrode and gate electrode lines 4A, 4B;

forming a first contact hole 7A by removing a portion of the first insulating layer on the source electrode 6B to expose a portion of the source electrode 6B;

depositing a first conducting layer 8 for charge storage electrode of polysilicon on the first insulating layer 7 and on the exposed source electrode 6B through the first contact hole 7A electrically connecting the source electrode 6B;

depositing a second insulating layer 9 on the entire surface of the resulting structure;

depositing a first photoresistive layer 10 on the second insulating layer 9;

forming a first pattern mask 10A having a linear dimension in the word line direction which is greater than the linear dimension in the bit line direction by removing the first photoresistive layer 10 from the second insulating layer 9 to expose the second insulating layer 9 except for a remaining portion of the first photoresistive layer 10A and the underlying second insulating layer 9 positioned over the source electrode 6B;

removing the exposed second insulating layer 9 by anisotropic etching the layer 9 utilizing the first pattern mask 10A thereby exposing the first conducting layer 8 except for remaining portions of the first conducting layer positioned over the source electrode 6B, of the second insulating layer 9A and of the first photoresistive layer 10A overlying the first conducting layer 8;

removing the remaining portion of the first photoresistive layer 10A overlying the remaining second insulating layer 9A;

depositing a second conductive layer 11 for charge storage electrode of polysilicon as thick as 1000 Angstroms over the resulting structure comprising the remaining portion of the second insulating layer 9A overlying the first conducting layer 8;

depositing a second photoresistive layer 12 on the second conducting layer 11;

forming a mask pattern 12A for charge storage electrode by forming a second pattern mask 12A having a linear dimension greater than the linear dimension of the first pattern mask 10A in the bit line direction and with the second pattern mask 12A having a linear dimension smaller than the linear dimension of the first pattern mask 10A in the word line direction over a predetermined region positioned above the source region 6B by removing the second photoresistive layer 12 to expose the second conducting layer 11 except for the remaining portion of the second conducting layer 11B underlying the second pattern mask 12A;

etching the exposed portion of the second conducting layer 11 utilizing the second pattern mask 12A by an anisotropic etching process;

removing the remaining portion of the second insulating layer 9A enclosed between the second conducting layer 11B for charge storage electrode and the first conducting layer 8 for charge storage electrode by a wet etching process thereby forming a tunnel space 9B between the second conducting layer 11B and the first conducting layer 8 in the word line direction;

removing the exposed first conducting layer 8 for charge storage electrode 8 by anisotropically etching utilizing the second pattern mask 12A to thereby form a charge storage electrode 11A consisting of the remaining second conducting layer 11B and the first conducting layer 8 and a tunnel space 9B overlying the source electrode 6B and then removing the second pattern mask 12A;

forming a capacitive dielectric layer 13 on the entire surface of the charge storage electrode 11A and on the walls 9C of the tunnel space 9B;

depositing a third conducting layer 14 for plate electrode, of polysilicon as thick as 1500 Angstroms on the entire surface of the charge storage electrode 11 A including on the capacitive dielectric layer formed on the walls of the tunnel space 9B;

forming a plate electrode 14A by removing a predetermined portion of the third conducting layer 14 by a mask patterning process to thereby form a stack capacitor 18;

depositing a third insulating layer 15 on the entire surface of the resulting structure comprising the plate electrode 14A;

removing the third insulating layer 15 deposited on the drain electrode 6A thereby forming a second contact hole 16 and exposing the surface of the drain electrode 6A; and forming a bit line electrode 17 on the third insulating layer 15 and on the first insulating layer 7 exposed on the wall of the second contact hole 16 to connect the bit line electrode through the second contact hole 16 to the drain of the MOSFET thereby increasing the area for the charge storage electrode 11A such that the capacitance of the stack capacitor is increased.

* * * * *